United States Patent [19]

Suzuki et al.

[11] Patent Number: 4,622,211
[45] Date of Patent: Nov. 11, 1986

[54] APPARATUS FOR SOLIDIFICATION WITH RESISTANCE HEATER AND MAGNETS

[75] Inventors: Toshihiko Suzuki; Nobuyuki Isawa; Yasunori Ohkubo; Kinji Hoshi, all of Kanagawa, Japan

[73] Assignee: Sony Corporation, Tokyo, Japan

[21] Appl. No.: 562,015

[22] Filed: Dec. 16, 1983

Related U.S. Application Data

[60] Division of Ser. No. 339,065, Jan. 13, 1982, which is a continuation of Ser. No. 188,519, Sep. 18, 1980, abandoned.

[30] Foreign Application Priority Data

Sep. 20, 1979 [JP] Japan .................... 54-121339
Jan. 28, 1980 [JP] Japan ....................... 55-8576
Jan. 28, 1980 [JP] Japan ....................... 55-8577
Jan. 28, 1980 [JP] Japan ....................... 55-8578

[51] Int. Cl.⁴ .............................................. C30B 35/00
[52] U.S. Cl. .................................... 422/248; 422/249
[58] Field of Search ............ 156/617 SP, 608, 616 R, 156/616 A, DIG. 70; 422/249, 248, 246

[56] References Cited

U.S. PATENT DOCUMENTS 3,464,812  9/1969  Utech et al. ................... 156/616 R
3,607,139  9/1971  Hanks ................................. 13/31

FOREIGN PATENT DOCUMENTS 1111544  3/1956  France ..................... 156/617 SP
993880  6/1965  United Kingdom .......... 156/617 SP
1347108  2/1974  United Kingdom .

OTHER PUBLICATIONS

Chedzey, Nature 5/28/66, pp. 933-934, V210.
Utech et al., Jl of Applied Physics, V37, No. 5 4/66, pp. 2021-2024.
Jl of Materials Science 5(1970) pp. 822-4 Witt.

Primary Examiner—Hiram H. Bernstein
Attorney, Agent, or Firm—Hill, Van Santen, Steadman & Simpson

[57] ABSTRACT

An apparatus for solidification comprising a container for a liquid material which is to be solidified and an electric heater around the container and energized to melt the liquid material, a pair of magnets beside the container producing a stationary magnetic field, a source of electricity to supply substantially DC current to said heater and means for pulling a solid crystal from said liquid material.

5 Claims, 9 Drawing Figures

APPARATUS FOR SOLIDIFICATION WITH RESISTANCE HEATER AND MAGNETS

This is a divisional application of Ser. No. 339,065 filed Jan. 13, 1982 which is a continuation of Ser. No. 188,519 filed Sept. 18, 1980, now abandoned.

BACKGROUND OF THE INVENTION

1. Field of the Invention

The present invention relates generally to a process for solidification of liquid material, and is directed more particularly to a process for solidification used in a crystal grown method of melt material with sufficient electrical conductivity.

2. Description of the Prior Art

In the art, when, for example, silicon is crystal-grown by the Czochralski method, since silicon melts at about 1420° C. which exceeds the critical Rayleigh number, thermal convective flow always occurs in the silicon melt. Therefore, the surface of the silicon melt is vibrated and hence the thickness of the boundary layer on the solid-liquid interface in the growing material is fluctuated. At this time, microscopic re-dissolution occurs in the grown crystal. Thus, point defects such as irregular segregation of impurities, swirl or the like appear in the crystal thus grown.

Also, the silicon melt reacts with the face of a crucible made of quartz ($SiO_2$) due to the thermal convective flow of silicon melt, and hence oxygen, which is one of the components of the quartz crucible, is dissolved into the silicon melt. In general, the crystal made as above contains oxygen of about $10^{18}$ atoms/$cm^3$. At a temperature where thermal oxidation is carried out in a process of manufacturing semiconductor devices, for example, 1000° C., the solubility of oxygen into silicon is about $3 \times 10^{17}$ atoms/$cm^3$. Therefore, during the usual heating process, the oxygen is supersaturated, and hence precipitation of oxygen occurs. The materials thus precipitated become seeds to make grow dislocation loops, stacking faults and so on. Further, the precipitation of $SiO_2$ causes warpage in a semiconductor wafer in the heating cycle during the manufacturing process thereof.

As described above, the silicon crystal manufactured by the Czochralski method presents problems such as microscopic fluctuation of impurity distribution, band-like segregation of oxygen, swirl, defects and so on. On the contrary, a silicon crystal manufactured by the floating zone method is less contaminated by a crucible material and the oxygen concentration thereof is less than $10^{16}$ atoms/$cm^3$. In this case, few oxygen atoms are precipitated. However, when the oxygen concentration in a crystal becomes lower than $1 \times 10^{17}$ atoms/$cm^3$, another problem appears in that the dislocation in the crystal is apt to be propagated leading to a trouble during the manufacture of a semiconductor device.

OBJECTS AND SUMMARY OF THE INVENTION

Accordingly, an object of the present invention is to provide a novel process for solidification of liquid in a container.

Another object of the invention is to provide a process for solidification in which a field is applied to liquid material such as melt solution or the like contained in a crucible in the direction transverse to the crucible (horizontal) to thereby suppress the convective flow of the melt or solution and hence control the dissolution of the component of the crucible into the melt or solution.

A further object of the invention is to provide a process for crystallization in which, in case a silicon crystal is grown up by the Czochralski method, a magnetic field is applied to a silicon melt to reduce its thermal convective flow and consequently to carry out a stable crystalline growth with few grown bands and uniformity.

A further object of the invention is to provide a process for crystallization used in manufacturing a semiconductor device in which the reaction of melt silicon with a crucible made of quartz is reduced to thereby lower the oxygen concentration in a grown crystal with the result of little precipitation of oxygen producing defects during the process for making a semiconductor device, less warpage of a semiconductor wafer which is convenient in a photo-process, little resistivity distribution in the wafer, and the longer life time to thereby make the device characteristic uniform and reduce dark current therein.

A further object of the invention is to provide a process for solidification which can be applied to manufacturing a crystal or alloy consisting of more than two kinds of materials different in density because convective flow is suppressed in molten materials.

A further object of the invention is to provide a process which can be applied to the growth of a ribbon crystal because the surface and its temperature of melt or solution is less fluctuated.

A still further object of the invention is to provide a process which can be applied to the crystal growth of a compound semiconductor such as GaAs and so on because of little dissolution of crucible component (Si) into a liquid material.

A yet further object of the invention is to provide a process which can be applied to the manufacture of a semiconductor crystal of high resistivity which is used for a device having high breakdown voltage or a high speed MOS type transistor.

According to an aspect of the present invention, a process for solidification is provided which comprises the steps of; providing a liquid material having electrical conductivity in a container, and applying a unidirectional stationary magnetic field to said liquid material so that the dissolution of at least one element material of said container into said liquid material is conducted substantially by diffusion thereof.

The other objects, features and advantages of the present invention will become apparent from the following description taken in conjunction with the accompanying drawings.

BRIEF DESCRIPTION OF THE DRAWINGS

FIG. 3 is a graph showing the relation between a relative rotation speed of a crucible and a crystal and oxygen concentration in a crystal;

FIG. 4 is a graph showing the oxygen concentration of a cross-section of a silicon crystal pulled up in the direction of <100> from the application to non-application of magnetic field;

FIG. 5 is a graph showing the relation between the strength of magnetic field applied to melt and the oxygen concentration in a crystal made from the melt;

FIG. 6 is a graph showing the distribution of oxygen concentration in a crystal along its longitudinal direction;

FIG. 7 is a graph showing the relation between the heat cycle times of a wafer and distortion thereof;

FIG. 8 is a graph showing the distribution of resistivity of a crystal with phosphorous doped therein along its radius direction; and FIG. 9 is a graph showing the distribution of resistivity of a crystal doped with boron along its longitudinal direction.

DESCRIPTION OF THE PREFERRED EMBODIMENT

Figure 1:
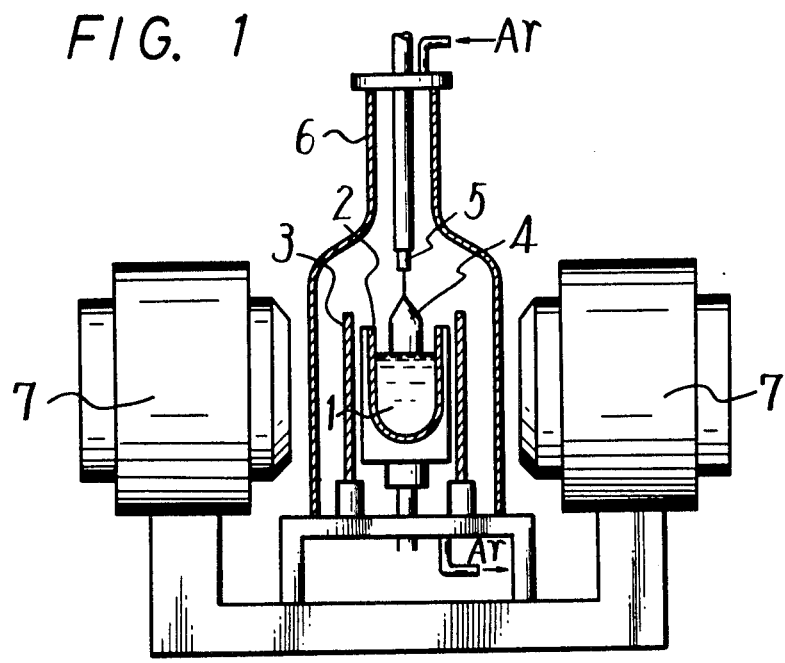
FIG. 1 is a schematic diagram showing an apparatus practising the Czochralski method to which the present invention is applied.

In order to well understand the present invention, a general description of the art to which this invention relates.

The driving force, which causes a convective flow in melt, is related with the Rayleigh number $N_{Ra}$. When the gravitational acceleration is taken as g, the thermal expansion coefficient of melt as $\alpha$, the temperature difference of the melt in the lateral direction (along which a magnetic field is applied) as $\Delta T$, the inner diameter of a crucible in which the melt is as D, the kinematic viscosity of the melt as $\nu$, and the thermal diffusion coefficient as k, respectively, the Rayleigh number $N_{Ra}$ is expressed as follows:

$$N_{Ra} = g \cdot \alpha \cdot \Delta T \cdot D^3 / \nu \cdot k \quad (1)$$

In case that the Rayleigh number is less than the critical one (about $2 \times 10^3$), the convective flow in the melt is approximately laminar flow and hence the melt is stable, but when the Rayleigh number exceeds the critical one the convective flow becomes irregular gradually, then the melt becomes stirred. As the diameter of the crucible becomes large, large Rayleigh number becomes a problem. For example, it is about $10^7$ in case that D=20 cm and the weight of silicon melt is about 30–50 kgr.

Recently, a wafer with a large diameter (for example, 12 cm) is required, so that it is important to suppress convective flow in melt so as to manufacture a good wafer.

It is known that when magnetic field is applied to a fluid having good electrical conductivity, its effective viscosity becomes high because moving fluid traversing the magnetic field is subjected to a force right-angled to its moving direction by the Lenz's Law.

The viscosity of silicon in melt is $8 \times 10^{-3}$ g/cm.sec which is smaller than that of water at 20° C. When the magnetic field of 2000 Gausses is applied to the silicon melt, its effective viscosity becomes 10 g/cm.sec.

Denoting the critical Rayleigh number as $N_{Ra}^c$, it is expressed as $$N_{Ra}^c = \pi^2 M^2 \quad (2)$$

where M is dimensionless Hartmann number, which is proportional to the magnitude of magnetic field. When the magnetic field is applied to the critical Rayleigh number becomes large, for example, it is about $9 \times 10^7$ at the magnetic field of 1500 Guasses, and the before-mentioned Rayleigh number $10^7$ is smaller and the convective flow is suppressed. For merely supressing the stirring of fluid, it is sufficient to apply a magnetic field of about several hundred Guasses to the fluid.

The velocity of convective flow in melt is 5 to 10 mm/sec when no magnetic field is applied to the melt, and is small enough not to be measured when a magnetic field with the strength of 4000 Gausses is applied to the melt.

As the stirring of melt disappears due to the application of magnetic field, the driving force, which contributes the movement of the atoms of solute dissolved into solution for crystal growth, is only that of diffusion. As a result, a boundary layer of diffusion becomes thick to be stable. Further, the reaction of silicon melt with a quartz crucible, $si + SiO_2 \rightarrow 2SiO$, is suppressed and the dissolved oxygen is transferred to the solid-liquid interface not by the convective flow but only by the diffusion. Thus, the oxygen concentration in the crystal is reduced.

In the art, it has been known that, in an InSb crystal grown method of the horizontal system, magnetic field is applied to its melt to suppress thermal convective flow therein (Journal of Applied Physics, Vol. 37, P 2021, 1966 or U.S. Pat. No. 3,464,812, and Nature, Vol. 210, P933 1966). Thereafter, it was attempted that the application of magnetic field is employed in the InSb crystal growth by the Czochralski method (Journal of Materials Science, Vol. 5, P822, 1970). In that experiment though, it was observed that the viscosity of melt was increased and the thermal convective flow in the melt was reduced, the uniformity of impurity distribution and the stability of the melt surface were made worse by the application of magnetic field. Thus, it was reported that the application of magnetic field in the Czochralski method turned out to have no advantage. No attempt to apply magnetic field in crystal growth has been carried out thereafter.

Now, an example of the present invention, which is applied to the Czochralski method for growing silicon crystal to reduce the thermal convective flow in silicon melt by applying a unidirectional stationary magnetic field to the silicon melt, will be described.

FIG. 1 is a schematic diagram showing an apparatus for practising the Czochralski method to which an example of the present invention is applied. In FIG. 1, 1 designates a melt material with high electric conductivity such as melt of silicon. This silicon melt 1 is in a container or crucible 2 of insulator such as quartz. A heater 3 is disposed outside the container 2 to heat the container 2. In this case, a silicon single crystal 4 is pulled up through a single crystal seed by a pulling-up chuck 5. The pulling-up rod including the chuck 5 is surrounded by a stainless steel jacket 6 within which argon gas circulates. At the outside of the stainless steel jacket 6, provided are a pair of magnetic field generating means such as electro-magnets 7 which face with each other through the jacket 6 therebetween. In this case, the horizontal distance between the poles of the electro-magnets 7 is selected as, for example, 35 cm, and the heater 3 is made of a zigzag-pattern resistor which is supplied with a DC current with ripple components less than 4% or an AC current or pulsating current more than 1K cycle so as to prevent the vibration of the heater 3.

2 to 3 minutes after the magnetic field of 4000 Gausses is applied to the melt 1 in the container 2 from the electro-magnets 7, the temperature of the melt 1, which fluctuated before, becomes stable and the surface of the melt 1, which rippled before, becomes smooth.

The temperature fluctuation of the melt is 5° to 10° C. when no magnetic field is applied thereto but becomes 0.1° to 0.2° C. when magnetic field is applied thereto.

Figure 2:
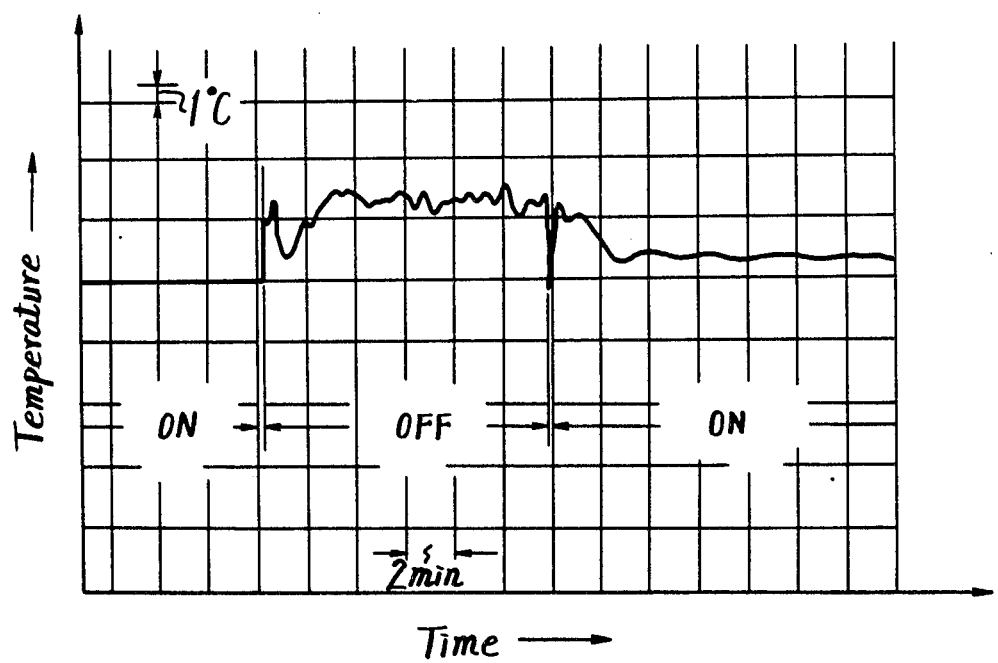
FIG. 2 is a graph showing the temperature of melt in a container apart from its wall by 3 cm.

FIG. 2 is a graph showing the temperature of the melt at the position away from the wall of the crucible by 3 cm. If the heat transfer between the melt in the crucible and the outside thereof is constant, the temperature distribution of the melt in the crucible is constant and the temperature gradient in the melt is sharper when magnetic field is applied thereto. The sharp or abrupt temperature gradient in the melt along the direction of crystal growing avoids the melt being over-cooled.

The side surface of a crystal ingot, which is grown with magnetic field, is smooth since the ripple on the surface of the melt and the temperature fluctuation thereof are small.

Comparing cross-sections of crystals, pulled up without rotation a stripe patterns are clearly observed on the cross-section of the crystal with no magnetic field applied thereto because of the difference of impurity concentration caused by the difference of growing speed due to temperature fluctuation, but no such a stripe pattern is observed on the cross-section of the crystal with magnetic field being applied thereto. In the crystal made by the Czochralski method, highly concentrated oxygen is precipitated in the stripe pattern.

In this invention, the crucible 2 and pulling-up chuck 5 are not rotated relatively or slowly rotated relatively at about 0.1 to 0.2 rpm for example.

FIG. 3 is a graph showing the relation between the relative rotation speed between the crucible and pulling-up chuck and the oxygen concentration in the crystal thus grown. In the graph of FIG. 3, the broken line represents the case where no magnetic field is applied, and the solid line represents the case where magnetic field of 4000 Gausses is applied.

In order to grow a crystal with a completely circular cross-section without rotation, the heater 3 is divided into plural heater members, for example, eight heater members, which are located on a circle outside the crucible 2 with an equal angular distance, and the temperature of each heater members is independently controlled.

FIG. 4 is a graph showing the comparison of oxygen concentration on the cross-section of silicon crystal which is grown along <100> direction during the transition in which magnetic field is applied then turned off.

FIG. 5 is a graph showing the relation between the strength of magnetic field applied to melt and the oxygen concentration in the crystal of which diameter is 76 mm, under the condition that its seed is rotated at a speed of 20 rpm and the pulling-up speed is 1 mm/min. In this case, at the application of magnetic field of about 1500 gausses, thermal convective flow in the melt disappears, and at larger than that the oxygen concentration is not much changed. However, in order to suppress the ripple of melt surface due to external mechanical vibration, it is meaningful to apply a magnetic field larger than 1500 Gausses.

FIG. 6 is a graph showing the distribution of oxygen concentration in a crystal along its longitudinal direction. White dots represent the oxygen concentration in the crystal grown up with no magnetic field applied to its melt, while black dots represent the oxygen concentration in the crystal grown up with magnetic field applied to its melt. The preferrable range of the oxygen concentration in crystal is $3 \times 10^{17}$ to $7.5 \times 10^{17}$ atoms/cm$^3$ to avoid oxygen precipitation in the crystal and the vulnerability by thermal shock. (The oxygen concentration is measured in ASTM F121-79 standard.) Crystal grown up with magnetic field satisfy this condition. When crystal grown up with magnetic field which has the oxygen concentration of $5 \times 10^{17}$ atom/cm$^3$ is thermally oxidized, the oxidation induced stacking faults (OSF) and dislocations due to the precipitation of oxygen are not observed. The generation of dislocation loop by oxygen precipitation causes warpage and distortion in a wafer after the heating cycles.

FIG. 7 is a graph showing the relation between the times of heating cycles of a wafer and the warpage thereof after the wafer, which is 52 mm in diameter and 380 μm in thickness is subjected to heat treatment at 1050° C. for 100 hours and thereafter is abruptly cooled from 1100° C. to the room temperature. In the graph of FIG. 7, a curve A represents a Czochralski crystal grown up without magnetic field whose oxygen concentration is $3 \times 10^{18}$ atoms/cm$^3$, a curve B represents a floating zone crystal without magnetic field whose oxygen concentration is $1 \times 10^{16}$ atoms/cm$^3$, and a curve C represents a Czochralski crystal with magnetic field applied to its melt whose oxygen concentration is $5 \times 10^{17}$ atoms/cm$^3$, respectively. The oxygen concentration above the suitable range causes the oxygen precipitation in the wafer and the oxygen concentration below the suitable range does not prevent the dislocation propagation, either contributes to the occurence of the wafer warpage.

FIG. 8 is a graph showing the distribution of the resistivity of a phosphorus doped crystal in the radial direction. In the graph of FIG. 8, black dots on the upper portion represent the resistivities of crystal grown up without magnetic field and white dots on the lower portion of the graph represent the resistivities of crystal with magnetic field applied to its melt, respectively. The deviation among the resistivities distribution in the latter is less than that in the former.

FIG. 9 is a graph showing the distribution of resistivity of a crystal doped with boron, which is heat-treated at 450° C. for 100 hours to generate donors, in its longitudinal direction. A curve D represents the crystal which is grown up without magnetic field and whose oxygen concentration is $1.1 \times 10^{18}$ atoms/cm$^3$, and a curve E represents the crystal which is grown up with magnetic field and whose oxygen concentration is $4 \times 10^{17}$ atoms/cm$^3$, respectively. In the case of the former (D), the oxygen which is partially segregated in the crystal becomes an impurity of the donor type and the resistivity of the crystal is varied microscopically. In this invention, obtained is a wafer of a P type with the resistivity of 200 Ωcm from a non-doped crystal.

In case of magnetic field applied the thickness of the boundary layer (diffusion layer) between solid and liquid interface increases and it is supposed that the effective segregation coefficient is increased by about 20% with phosphorus doping.

Without applying magnetic field to the silicon melt, the oxygen concentration of silicon melt in the quartz crucible of which diameter is 123 mm is about $1 \times 10^{18}$ atoms/cm$^3$ either at the center or peripheral portions of the crucible, while with applying the magnetic field of 4000 Gausses to the silicon melt the oxygen concentration is $9 \times 10^{17}$ atoms/cm$^3$ and $6.6 \times 10^{17}$ atoms/cm$^3$ at the peripheral and center portions of the silicon melt in the quartz crucible, respectively.

When the magnetic field is applied to the silicon melt convective flow therein is reduced, hence the reaction of the silicon melt with the quartz crucible or the dissolution of the crucible component (SiO or O) is reduced, then the transportation of oxygen is done only by diffusion and the transportation speed of oxygen becomes low or dissolving speed of oxygen becomes low, consequently the movement of oxygen to the interface between solid and liquid is reduced.

The present invention can be applied not only to the Czochralski method but also to such a method in which material is grown along the vertical or horizontal direction in a ribbon (or plate) shape with the ripple at the surface of the liquid and the temperature fluctuation thereof being small.

Further, according to the invention, in case that, for example, GaAs is grown from its solution contained in a quartz crucible, the dissolution of silicon and oxygen into the solution can be reduced.

Also, by the invention, upon the liquid phase epitaxial growth of, for example, GaAs it reduces the convective flow of Ga solution to suppress the surface ripple.

Further, upon the crystal growth of, for example, ferrite material by the Bridgman method, the dissolving of crucible material can be reduced by the invention.

Further, the present invention can be applied to the crystal growth of metal and dielectric manufacture of alloys and so on in addition to the crystal growth of semiconductor or magnetic material.

It will be apparent that many modifications and variations could be effected by one skilled in the art without departing from the spirits or scope of the novel concepts of the present invention.

We claim as our invention:

1. An apparatus for solidification comprising, a container made of an electrical insulator for a liquid material to be solidified, an electric resistance heater around said container energized to melt said liquid material, a pair of magnets beside said container producing a stationary magnetic field, a source of electricity to supply DC current with ripple components less than 4% and to eliminate strong vibration to said heater and means for pulling a solid crystal from said liquid material.

2. An apparatus according to claim 1, wherein said heater is placed in said magnetic field.

3. An apparatus according to claim 1, wherein said magnetic field passes through said molten material.

4. An apparatus according to claim 1, wherein said container is a crucible.

5. An apparatus according to claim 1, wherein said electric heater has vertical components relative to said stationary magnetic field.

* * * * *